(12) United States Patent
Hsu (10) Patent No.: US 8,622,757 B2
(45) Date of Patent: Jan. 7, 2014

(54) WIRELESS NETWORK INTERFACE DEVICE (75) Inventor: Chun-Yu Hsu, Taipei County (TW)

(73) Assignee: Bandrich, Inc., Taipei County (TW)

( * ) Notice: Subject to any disclaimer, the term of this patent is extended or adjusted under 35 U.S.C. 154(b) by 678 days.

(21) Appl. No.: 12/917,674

(22) Filed: Nov. 2, 2010

(65) Prior Publication Data
US 2012/0106412 A1 May 3, 2012

(51) Int. Cl.
*H01R 13/44* (2006.01)

(52) U.S. Cl.
USPC .......................................... 439/131

(58) Field of Classification Search
USPC .......................................... 439/131
See application file for complete search history.

(56) References Cited

U.S. PATENT DOCUMENTS

| | | | |
|---|---|---|---|
| 6,758,689 B1 * | 7/2004 | Bair et al. ............... | 439/136 |
| 7,530,823 B1 * | 5/2009 | Thornton et al. ......... | 439/136 |
| 7,632,113 B2 * | 12/2009 | Finn ...................... | 439/131 |
| 8,274,447 B2 * | 9/2012 | Zhang et al. ............ | 343/906 |
| 8,308,494 B1 * | 11/2012 | Zhao ..................... | 439/131 |
| 8,469,729 B2 * | 6/2013 | Ding ..................... | 439/131 |

* cited by examiner

*Primary Examiner* — Xuong Chung Trans
(74) *Attorney, Agent, or Firm* — Rosenberg, Klein & Lee (57) ABSTRACT

A wireless network interface device with concealable electrical interface includes a casing unit, a wireless receiver unit, an elastic assembly and an actuator. The casing unit has an outer body, an interface opening, and an actuator opening. The wireless receiver unit has a receiving module and an I-shaped groove. The I-shaped groove has a first recess and a second recess bridged by a connecting recess. The elastic assembly has at least one first elastic member. The actuator has a second elastic member, a releaser member, and a locking member. When the locking member is engaged to the first recess, at least one first elastic member is compressed with the electrical interface being concealed inside the casing unit. When the releaser member is pressed, the locking member disengages from the first recess, and at least one first elastic member pushes the receiving module to expose the electrically connected electrical interface.

20 Claims, 6 Drawing Sheets

WIRELESS NETWORK INTERFACE DEVICE

BACKGROUND OF THE INVENTION

1. Field of the Invention

The instant disclosure relates to a wireless network interface device; in particular, a wireless network interface device with concealable electrical interface.

2. Description of the Related Art

With the wide spread of personal computers and internet, a vast array of information resources are exchanged. Currently, most internet connections are based on landlines such as cable internet access or fiber optic cables. However, the installation and maintenance costs for the fixed line infrastructures are very high. The ubiquitous adaptation of wireless network would resolve such issue.

Currently, mobile electronic devices such as laptop computers require the installation of wireless internet interfaces to establish wireless internet connection. Heavy emphasis has been given to increasing data transfer speed of such wireless interface devices. Major advancements in such area includes the 2G Global System for Mobile Communications (GSM), 2.5G General Packet Radio Service (GPRS), the 3G Wideband Code Division Multiple Access (W-CDMA), and the 3.5G High-Speed Downlink Packet Access (HSDPA).

Most conventional wireless internet cards require antennas for transferring and receiving wireless signals. The location and design of the antenna is very critical for the data transfer speed and quality. In addition, the setting of the wireless network varies regionally, so the optimization of the antenna design is very critical in assuring data transfer quality.

With the maturity of wireless interface technology, modern wireless internet interface devices have been designed to incorporate Universal Serial Bus (USB) interface. The USB interface provides fast and convenient adaptation of wireless interface devices to modern personal computing devices. However, the exposing connector of the USB device is less robust than the traditional bulky connecting interfaces, such as the PCMCIA card bus. Thus, conventionally, a cover is used to shield the exposed USB interface from being damaged. However, because the cover is not interconnected to the device, the cover can be easily lost or misplaced accidentally. In addition, the cover may loosen from the device after repeated use. Therefore, the cover does not offer a secured protection for the USB interface, which enhances the risk of damaging the USB interface and shorten the service life.

To address the above issues, the inventor proposes the following solution.

SUMMARY OF THE INVENTION

The instant disclosure provides a wireless network interface device with concealable electrical interface to address the issue of shielding the electrical interface. The device comprises a casing unit, a wireless receiver unit, an elastic assembly, and an actuator. The casing unit has an outer body, where the outer body is slotted in forming at least one interface opening and at least one actuator opening. Internal of the outer body, the wireless receiver unit has a receiving module and an I-shaped groove formed thereon. The I-shaped groove is defined by a first recess, a second recess, and a connecting recess bridging the first and second recess. The electrical interface is electrically connected to one end of the receiving module and can penetrate through at least one interface opening to be exposed externally. The elastic assembly has at least one first elastic member disposed within the outer body and compressed in between the casing unit and the receiving module. The actuator comprises a second elastic member disposed within the outer body, a releaser member attached to the second elastic member and exposed outside the outer body by penetrating at least one actuator opening, and a locking member connected to the second elastic member for engaging the first or second recess of the I-shaped groove. Thereby, when the locking member engages to the first recess of the I-shaped groove, at least one first elastic member is compressed in concealing the electrical interface within the outer body. Conversely, when the releaser member is pressed in dislodging the locking member from the first recess of the I-shaped groove, the receiving module is pushed to expose the electrical interface from the outer body. As the connecting recess slides past the locking member, it engages the second recess. The electrical interface is thus locked in the exposed position.

The instant disclosure further provides a wireless network interface device with concealable electrical interface to address the issue of shielding the electrical interface. The device comprises a casing unit, a wireless receiver unit, an elastic assembly, and an actuator. The casing unit has an outer body, where the outer body is slotted in forming at least one interface opening and at least one actuator opening. Internal of the outer body, the wireless receiver unit has a receiving module and a groove formed thereon. The electrical interface is electrically connected to one end of the receiving module and can penetrate through at least one interface opening to be exposed externally. The elastic assembly has at least one first elastic member disposed within the outer body and compressed in between the casing unit and the receiving module. The actuator comprises a second elastic member disposed within the outer body, a releaser member attached to the second elastic member and partially exposed outside the outer body by penetrating at least one actuator opening, and a locking member connected to the second elastic member for engaging the first or second recess of the groove.

Yet, the instant disclosure provides another wireless network interface device with concealable electrical interface to address the issue of shielding the electrical interface. The device comprises a casing unit, a wireless receiver unit, an elastic assembly, and an actuator. The casing unit has an outer body, where the outer body is slotted in forming at least one interface opening and at least one actuator opening. Internal of the outer body, the wireless receiver unit has a receiving module and a first engaging member formed thereon. The electrical interface is electrically connected to one end of the receiving module and can penetrate through at least one interface opening to be exposed externally. The elastic assembly has at least one first elastic member disposed within the outer body and compressed in between the casing unit and the receiving module. The actuator comprises a second elastic member disposed within the outer body, a releaser member attached to the second elastic member and exposed outside the outer body by penetrating at least one actuator opening, and a second engaging member connected to the second elastic member for complementing the first engaging member.

In summary, the first aspect of the instant disclosure comprises an I-shaped groove having a first recess, a second recess, and a connecting recess, along with an actuator having a second elastic member, a releaser member, and a locking member. In another aspect, the instant disclosure comprises a groove and an actuator having a second elastic member, a releaser member, and a locking member. Yet, in another aspect, the instant disclosure comprises a first engaging member and an actuator having a second elastic member, a releaser member, and a second engaging member. Based on any of the above aspect, the electrical interface of the wireless network interface device can be concealed internally of the casing unit.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE INVENTION

Please refer to FIGS. 1A, 1B, 2A, 2B, and 3, which show a wireless network interface device with concealable electrical interface C having a casing unit 1, a wireless receiver unit 2, an elastic assembly 3, and an actuator 4.

The casing unit 1 has an outer body 10, where the outer body 10 is slotted in forming at least one interface opening 11 and at least one actuator opening 12. The electrical interface C can be exposed from the interface opening 11, as illustrated in FIGS. 1B and 2B. Optionally, the casing unit 1 may further comprise a fixing frame 13 having a thru hole 130 adjacent to the interface opening 11.

Next, the wireless receiver unit 2 has a receiving module 20 and an I-shaped groove 21 formed thereon internal of the outer body 10. If the fixing frame 13 is excluded, the receiving module 20 is directly enclosed by the outer body 10. If the fixing frame 13 is included, the receiving module 20 would be enclosed by the fixing frame 13 instead as shown in FIGS. 2A and 2B. Meanwhile, an I-shaped groove 21 is defined by grooving the outer surface of the receiving module 20. The I-shaped groove 21 has a first recess 210, a second recess 211, and a connecting recess 212 bridging the first recess 210 and the second recess 211. The electrical interface C is electrically connected to one end of the receiving module 20 and can penetrate through at least one interface opening 11 to be exposed externally. Such condition is shown in FIGS. 1B and 2B.

Within the outer body 10, the elastic assembly 3 has at least one first elastic member 30. If the fixing frame 13 is excluded, at least one first elastic member 30 is disposed in between the inner surface 100 of the casing unit 10 and the side surface 200 of the receiving module 20. If the fixing frame 13 is included, at least one first elastic member 30 is disposed in between the inner surface 131 of the fixing frame 13 and the side surface 200 of the receiving module 20.

Figure 1A:
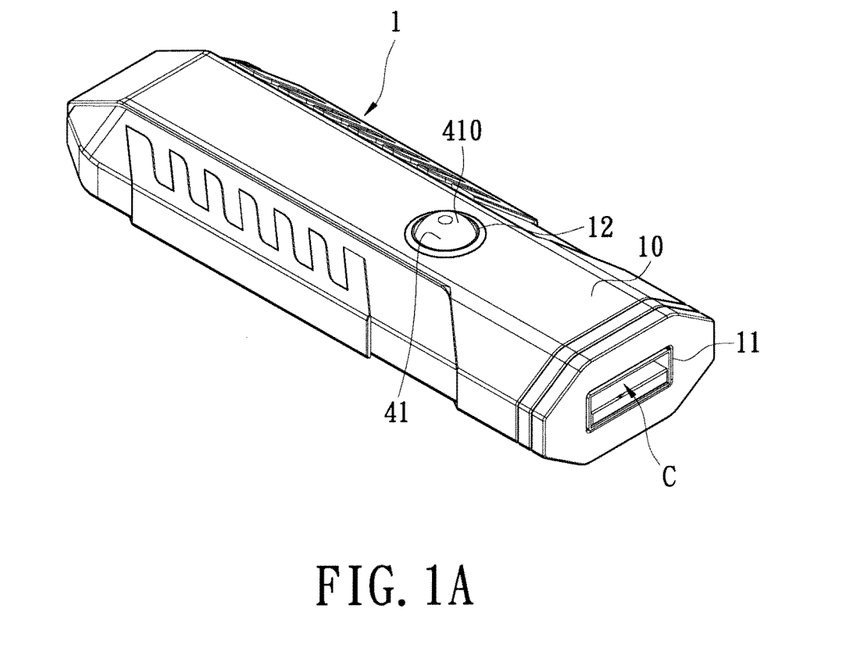
FIG. 1A is an isometric view of a wireless network interface device with concealable electrical interface, showing a concealed electrical interface.
Figure 1B:
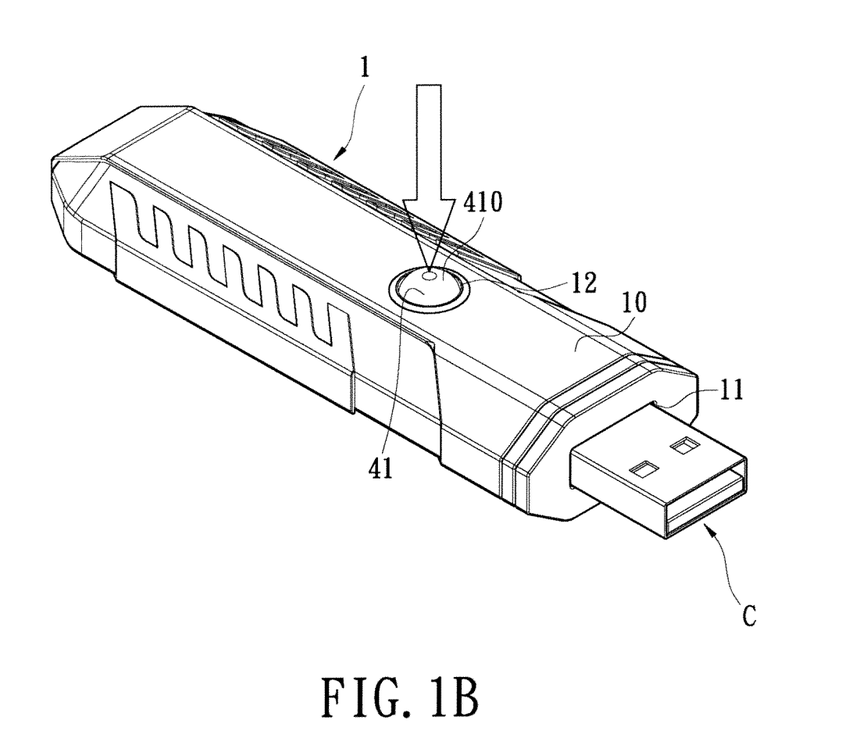
FIG. 1B is an isometric view of a wireless network interface device with concealable electrical interface, showing an exposed electrical interface.
Figure 2A:
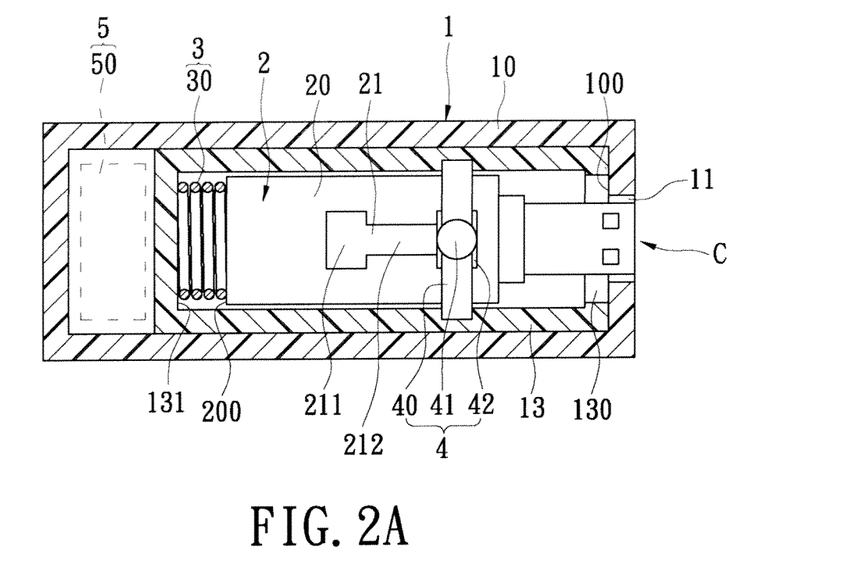
FIG. 2A is a top, cross-sectional view of a wireless network interface device with concealable electrical interface, showing a concealed electrical interface.
Figure 2B:
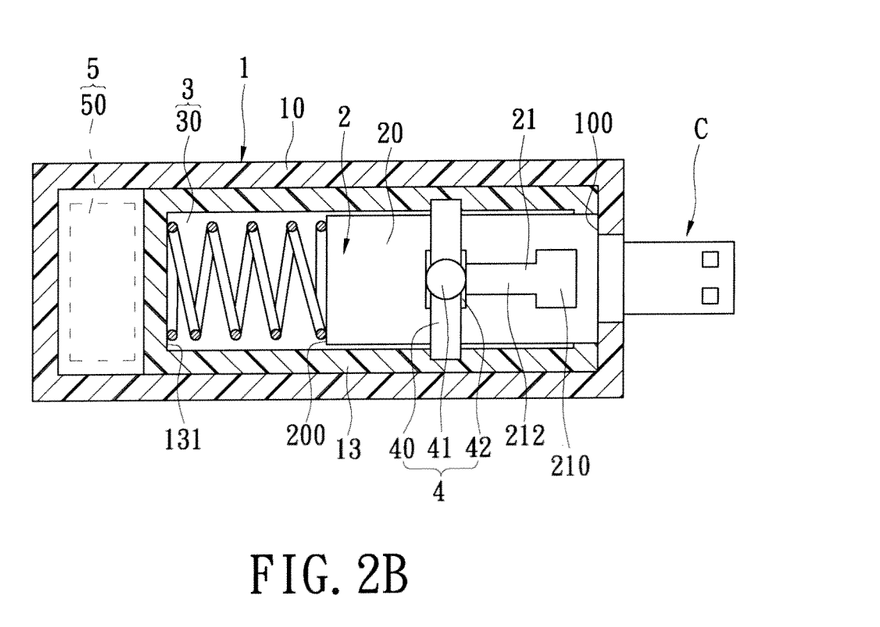
FIG. 2B is a top, cross-sectional view of a wireless network interface device with concealable electrical interface, showing an exposed electrical interface.

Next, the actuator 4 comprises a second elastic member 40 internal of the outer body 10; a releaser member 41 connected to the second elastic member 40 and exposed from the outer body 10 by penetrating at least one actuator opening 12 shown in FIGS. 1A and 1B; and a locking member 42 connected to the second elastic member 40, where the locking member 42 can be engaged to the first recess 210 or the second recess 211 of the I-shaped groove 21 as shown in FIGS. 2A and 2B. The second elastic member 40 may be manufactured from metallic or plastic materials. When the fixing frame is excluded, the ends of the second elastic member 40 are secured to the inner surface 100 of the casing unit 10. As shown in FIGS. 2A and 2B, if the fixing frame 13 is included, the ends of the second elastic member 40 are secured to the fixing frame 13 instead.

Yet, when the fixing frame 13 is included for the instant disclosure, the wireless network interface device with concealable electrical interface further includes an internal antenna 5. The antenna 5 has at least one antenna module 50 disposed internal of the outer body 10 and in between the inner surface 100 of the casing unit 10 and the side surface of the fixing frame 13.

Figure 3:
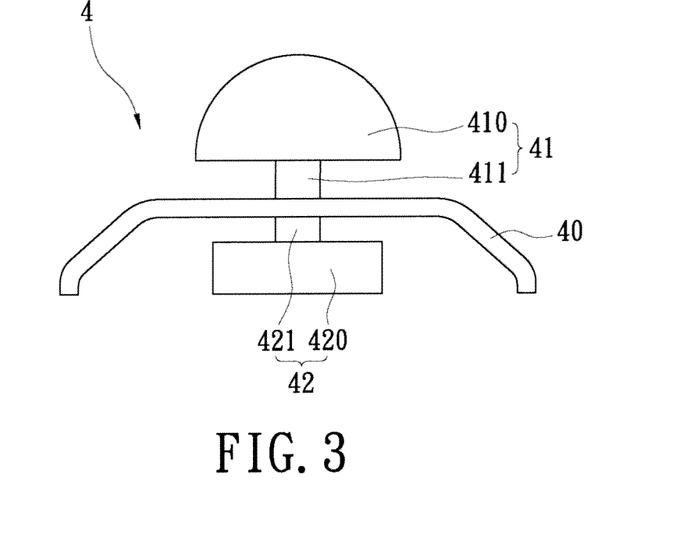
FIG. 3 is a side view of an actuator of a wireless network interface device with concealable electrical interface.

Next, FIG. 3 shows the releaser member 41, which comprises a main body 410 and an extension 411. The extension 411 protrudes off the bottom of the main body 410 and is connected to the second elastic member 40. The main body 410 is partially accommodated within at least one actuator opening 12, with other portion exposed from the outer body 10. Meanwhile, the locking member 42 has a locking piece 420 and a connecting arm 421, where the connecting arm 421 protrudes off the top of the locking piece 420 and connects to the second elastic member 40. As shown in FIGS. 2A and 2B, the locking piece 420 can engage to the first recess 210 or the second recess 211 of the I-shaped groove 21, while the connecting arm 421 can slide within the connecting recess 212.

Figure 4A:
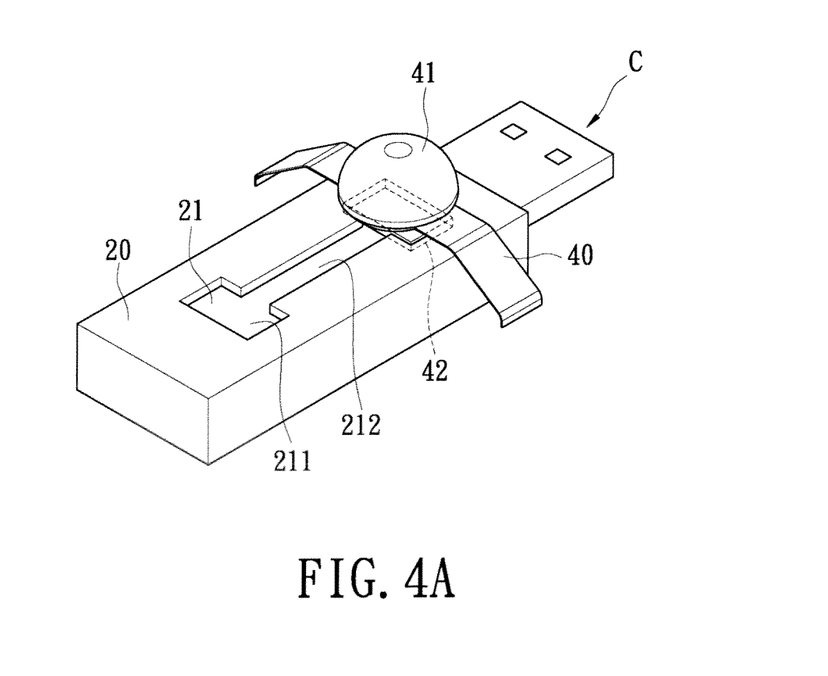
FIG. 4A is a partial isometric view of a wireless network interface device with concealable electrical interface, showing a locking member engaged to a first recess.
Figure 4B:
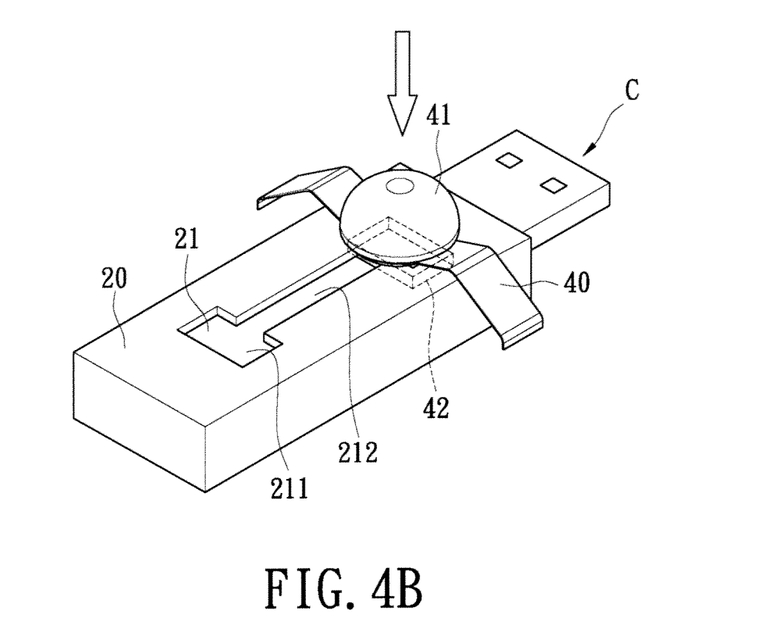
FIG. 4B is a partial isometric view of a wireless network interface device with concealable electrical interface, showing a locking member dislodging from a first recess.
Figure 4C:
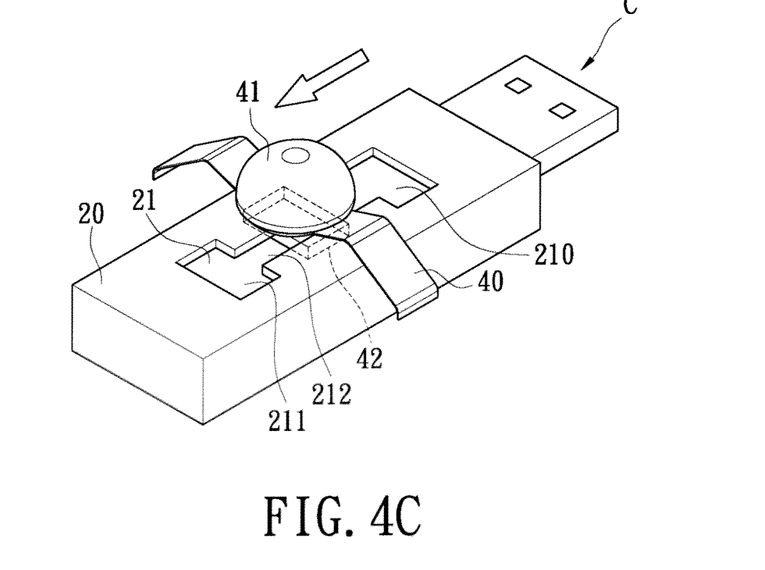
FIG. 4C is a partial isometric view of a wireless network interface device with concealable electrical interface, showing a connecting recess sliding across a locking member.
Figure 4D:
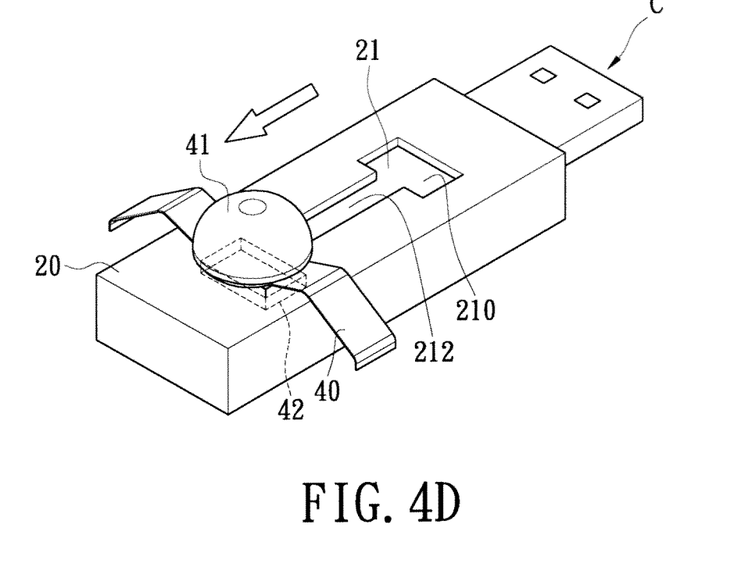
FIG. 4D is a partial isometric view of a wireless network interface device with concealable electrical interface, showing a locking member underneath a second recess.
Figure 4E:
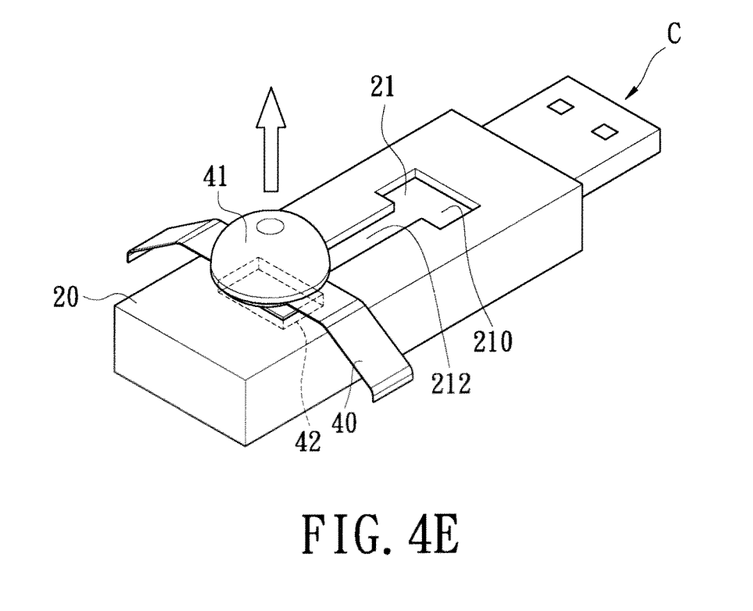
FIG. 4E is a partial isometric view of a wireless network interface device with concealable electrical interface, showing a locking member engaged to a second recess.

Functionally, FIGS. 1A, 2A, and 4A show the electrical interface C as being concealed in the outer body 10, with at least one first elastic member 30 in compressed state, and the locking member 42 engages to the first recess 210 of the I-shaped groove 21. To expose the electrical interface C, the releaser member 41 is pressed downward as indicated by the arrow in FIG. 4B. The downward motion releases the locking member 42 from the first recess 210 of the I-shaped groove 21. By disengaging from the locking member 42, the receiving module 20 is moved by at least one first elastic member 30 in releasing the stored energy. Meanwhile, the receiving module 20 slides past the connecting arm 421 of the locking member 42 via the connecting recess 212. Finally, the receiving module 20 is stopped by the actuator 4 as the releaser member 41 is let go. When the releaser member 41 is let go, the locking member 42 is pushed upward by the second elastic member 40 and engages the second recess 211 of the I-shaped groove 21. The above process is shown in FIGS. 4D and 4E. At such state, the electrical interface C is completely exposed from the outer body 10 as shown in FIGS. 1B and 2B.

In other words, when the locking member 42 is engaged to the first recess 210 of the I-shaped groove 21, the electrical interface C is being held within the outer body 10 with at least one first elastic member 30 in a compressed state. When the locking member 42 releases from the first recess 210 of the I-shaped groove 21 by pressing the releaser member 41, the receiving module 20 is moved by at least one first elastic member 30 to expose the electrical interface C as shown in FIGS. 1B and 2B. While the receiving module 20 is moving, the connecting recess 212 slides past the locking member 42. At the final exposed state, the locking member 42 is engaged to the second recess 211 of the I-shaped groove 21. The above described operation is illustrated from FIGS. 4C to 4E.

Alternatively, the I-shaped groove 21 can be replaced with other types of groove. In addition, the I-shaped groove 21 can be replaced by a first engaging member and the actuator 4 can be replaced by a second engaging member to achieve the same purpose.

In summary, the first embodiment of the instant disclosure comprises an I-shaped groove having a first recess, a second recess, and a connecting recess, along with an actuator having a second elastic member, a releaser member, and a locking member. In another embodiment, the instant disclosure comprises a groove and an actuator having a second elastic element, a releaser member, and a locking member. Yet, in another embodiment, the instant disclosure comprises a first engaging member and an actuator having a second elastic member, a releaser member, and a second engaging member. Based on any of the above choices, the electrical interface of the wireless network interface device can be concealed internally of the casing unit.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A wireless network interface device having concealable electrical interface, comprising:
    a casing unit having an outer body, the outer body defining an interface opening and an actuator opening;
    a wireless receiver unit including a receiving module having an I-shaped groove formed thereon, wherein the I-shaped groove has a first recess, a second recess, and a connecting recess bridging the first recess and the second recess, wherein the electrical interface is electrically connected to one end of the receiving module, the electrical interface can pass through the interface opening to expose externally;
    an elastic assembly having a first elastic member disposed in the casing unit between an internal surface thereof and the receiving module;
    an actuator having a second elastic member disposed in the casing unit in connection with a releaser member passing through the actuator opening of the casing unit to expose externally; and
    a locking member connected to the second elastic member for engaging to the I-shaped groove; the first elastic member is compressed and the electrical interface is concealed when the locking member engages to the first recess;
    whereby the electrical interface and the receiving module are pushed and exposed by the first elastic member when the locking member dislodges from the first recess and engages to the second recess via the connecting recess.

2. The wireless network interface device of claim 1, wherein the first elastic member is disposed in between an inner surface of the outer body and a side surface of the receiving module.

3. The wireless network interface device of claim 1, wherein the second elastic member is selected from the group consisting of metallic and plastic materials, the second elastic member having its ends fixed to the inner surface of the outer body.

4. The wireless network interface device of claim 1, wherein the releaser member having a main body, the main body having an extension extending therefrom and connecting to the second elastic member; the main body is partially accommodated within the actuator opening and partially exposed from the outer body.

5. The wireless network interface device of claim 1, wherein the locking member having a locking piece and a connecting arm extending therefrom, the connecting arm is connected to the second elastic member, the locking piece is for engaging and sliding within the I-shaped groove.

6. The wireless network interface device of claim 1, wherein the casing unit having a fixing frame inside the outer body, the fixing frame is adjacent to a thru hole of the interface opening and encloses the receiving module; the first elastic member is disposed in between an inner surface of the fixing frame and the side surface of the receiving module; the second elastic member having its ends connected to the fixing frame.

7. The wireless network interface device of claim 6, further comprising an antenna having an antenna module disposed in between the inner surface of the outer body and side surface of the fixing frame.

8. A wireless network interface device with concealable electrical interface, comprising:
    a casing unit having an outer body, the outer body defining an interface opening and an actuator opening;
    a wireless receiver unit including a receiving module having a groove formed thereon slidably disposed in the casing unit, wherein the electrical interface is electrically connected to one end of the receiving module, wherein the electrical interface is selectively configurable between a retracted configuration and an exposed configuration;
    an elastic assembly having a first elastic member disposed in the casing unit between a interior surface thereof and the receiving module;
    an actuator having a second elastic member disposed in the casing unit in connection with a releaser member passing through the actuator opening to expose externally; and
    a locking member connected to the second elastic member for engaging to the groove.

9. The wireless network interface device of claim 8, wherein the first elastic member is disposed in between an inner surface of the outer body and a side surface of the receiving module.

10. The wireless network interface device of claim 8, wherein the second elastic member is selected from the group consisting of metallic and plastic materials, the second elastic member having its ends fixed to the inner surface of the outer body.

11. The wireless network interface device of claim 8, wherein the releaser member having a main body, the main body having an extension extending therefrom and connecting to the second elastic member; the main body is partially accommodated within the actuator opening and partially exposed from the outer body.

12. The wireless network interface device of claim 8, wherein the locking member having a locking piece and a connecting arm extending therefrom, the connecting arm is connected to the second elastic member, the locking piece is for engaging and sliding within the groove.

13. The wireless network interface device of claim 8, wherein the casing unit having a fixing frame inside the outer body, the fixing frame is adjacent to a thru hole of the interface opening and encloses the receiving module; the first elastic member is disposed in between an inner surface of the fixing frame and the side surface of the receiving module; the second elastic member having its ends connected to the fixing frame.

14. The wireless network interface device of claim 13, further comprising an antenna having an antenna module disposed in between the inner surface of the outer body and side surface of the fixing frame.

15. The wireless network interface device of claim 8, wherein the groove is an I-shaped groove having a first recess, a second recess, and a connecting recess bridging the first recess and the second recess.

16. The wireless network interface device of claim 15, wherein the locking member having a locking piece and a connecting arm extending therefrom, the connecting arm is connected to the second elastic member, the locking piece is for engaging to the I-shaped groove and the connecting arm can slides within the I-shaped groove.

17. The wireless network interface device of claim 15, wherein the first elastic member is compressed and the electrical interface is concealed when the locking member engages to the first recess; the electrical interface and receiving module are pushed and exposed by the first elastic member when the locking member dislodges from the first recess and engages to the second recess via the connecting recess.

18. The wireless network interface device with concealable electrical interface, comprising:

a casing unit having an outer body, the outer body defining an interface opening and an actuator opening;

a wireless receiver unit having a receiving module and a first engaging member formed thereon; wherein an electrical interface is electrically connected to one end of the receiving module, the electrical interface can pass through the interface opening to expose externally;

an elastic assembly having a first elastic member in between the casing unit and the receiving module within the outer body; and an actuator having a second elastic member within the outer body, the second elastic member is connected to a releaser member which passes through the actuator opening to expose externally; a second engaging member is connected to the second elastic member for engaging to and sliding within the first engaging member.

19. The wireless network interface device of claim 18, wherein the first elastic member is disposed in between an inner surface of the outer body and a side surface of the receiving module; and the second elastic member is selected from the group consisting of metallic and plastic materials, the second elastic member having its ends fixed to the inner surface of the outer body.

20. The wireless network interface device of claim 18, wherein the releaser member having a main body, the main body having an extension extending therefrom and connecting to the second elastic member; the main body is partially accommodated within the actuator opening and partially exposed from the outer body.

\* \* \* \* \*